United States Patent
Hsieh et al.

(10) Patent No.: US 10,431,497 B1
(45) Date of Patent: Oct. 1, 2019

(54) MANUFACTURING METHOD OF EPITAXIAL FIN-SHAPED STRUCTURE

(71) Applicant: UNITED MICROELECTRONICS CORP., Hsin-Chu (TW)

(72) Inventors: Po-Kuang Hsieh, Kaohsiung (TW); Kuan-Hao Tseng, Kaohsiung (TW); Yu-Hsiang Lin, New Taipei (TW); Shih-Hung Tsai, Tainan (TW); Yu-Ting Tseng, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 33 days.

(21) Appl. No.: 15/951,192

(22) Filed: Apr. 12, 2018

(30) Foreign Application Priority Data

Mar. 21, 2018 (CN) .......................... 2018 1 0234864

(51) Int. Cl.
| | |
|---|---|
| *H01L 21/8234* | (2006.01) |
| *H01L 27/088* | (2006.01) |
| *H01L 29/78* | (2006.01) |
| *H01L 21/321* | (2006.01) |
| *H01L 21/28* | (2006.01) |

(52) U.S. Cl.
CPC ............... *H01L 21/823431* (2013.01); *H01L 21/28123* (2013.01); *H01L 21/3212* (2013.01); *H01L 27/0886* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 6,265,315 B1 | 7/2001 | Lee | |
| 7,348,284 B2 | 3/2008 | Doyle | |
| 8,367,534 B2 | 2/2013 | Chen | |
| 8,497,177 B1 | 7/2013 | Chang | |
| 8,673,755 B2 | 3/2014 | Chang | |
| 9,601,491 B1* | 3/2017 | Mallela | ............... H01L 27/0924 |
| 2015/0108585 A1* | 4/2015 | Loubet | ............ H01L 21/823431 |
| | | | 257/401 |
| 2015/0108589 A1 | 4/2015 | Cheng | |
| 2015/0155307 A1* | 6/2015 | Adam | ................. H01L 27/1211 |
| | | | 257/347 |

(Continued)

OTHER PUBLICATIONS

Feng, Title of Invention: Semiconductor Device and Method for Fabricating the Same, U.S. Appl. No. 15/139,305, filed Apr. 26, 2016.

*Primary Examiner* — Asok K Sarkar
(74) *Attorney, Agent, or Firm* — Winston Hsu (57) ABSTRACT

A manufacturing method of an epitaxial fin-shaped structure includes the following steps. A substrate is provided. A recess is formed in the substrate. An epitaxial layer is formed on the substrate. The epitaxial layer is partly formed in the recess and partly formed outside the recess. The epitaxial layer has a dent formed on the top surface of the epitaxial layer, and the dent is formed corresponding to the recess in a thickness direction of the substrate. A nitride layer is conformally formed on the epitaxial layer. An oxide layer is formed on the nitride layer. A first planarization process is performed to remove a part of the oxide layer, and the first planarization process is stopped on the nitride layer. The epitaxial layer in the recess is patterned for forming at least one epitaxial fin-shaped structure.

12 Claims, 5 Drawing Sheets

(56) References Cited

U.S. PATENT DOCUMENTS

| | | | |
|---|---|---|---|
| 2015/0333145 A1* | 11/2015 | Chudzik | H01L 29/66795 |
| | | | 257/401 |
| 2018/0090496 A1* | 3/2018 | Cheng | H01L 29/0653 |
| 2018/0211960 A1* | 7/2018 | Tung | H01L 21/30625 |
| 2019/0189784 A1* | 6/2019 | Basker | H01L 29/66795 |

* cited by examiner

MANUFACTURING METHOD OF EPITAXIAL FIN-SHAPED STRUCTURE

BACKGROUND OF THE INVENTION

1. Field of the Invention

The present invention relates to a manufacturing method of an epitaxial fin-shaped structure, and more particularly, to a manufacturing method including a planarization process for forming an epitaxial fin-shaped structure.

2. Description of the Prior Art

As the size of the field effect transistors (FETs) becomes smaller continuously, the conventional planar field effect transistor has difficulty in development because of the manufacturing limitations. Therefore, for overcoming the manufacturing limitations, the non-planar transistor technology such as fin field effect transistor (FinFET) technology is developed to replace the planar FET and becomes a development trend in the related industries. However, the manufacturing processes of the field effect transistors are more complicated relatively, and the related industries are endeavoring to simplify the processes and lower the manufacturing cost. Since the three-dimensional structure of a FinFET increases the overlapping area between the gate and the fin-shaped structure, the channel region can therefore be more effectively controlled by the gate. This way, the drain-induced barrier lowering (DIBL) effect and the short channel effect (SCE) of the device with smaller dimensions may be reduced. Additionally, a higher drain current may be obtained because the FinFET may have a wider channel width while the channel length is unchanged.

SUMMARY OF THE INVENTION

A manufacturing method of an epitaxial fin-shaped structure is provided in the present invention. A planarization process is performed after forming a nitride layer and an oxide layer on an epitaxial layer for improving the flatness of the epitaxial layer and improving the height uniformity of an epitaxial fin-shaped structure formed by the epitaxial layer.

According to an embodiment of the present invention, a manufacturing method of an epitaxial fin-shaped structure is provided. The manufacturing method includes the following steps. A substrate is provided. A recess is formed in the substrate. An epitaxial layer is formed on the substrate. The epitaxial layer is partly formed in the recess and partly formed outside the recess. The epitaxial layer has a dent formed on the top surface of the epitaxial layer, and the dent is formed corresponding to the recess in a thickness direction of the substrate. A nitride layer is conformally formed on the epitaxial layer. An oxide layer is formed on the nitride layer. A first planarization process is performed to remove a part of the oxide layer, and the first planarization process is stopped on the nitride layer. The epitaxial layer in the recess is patterned for forming at least one epitaxial fin-shaped structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic drawings illustrating a manufacturing method of an epitaxial fin-shaped structure according to a first embodiment of the present invention, wherein

FIG. 9 and FIG. 10 are schematic drawings illustrating a manufacturing method of an epitaxial fin-shaped structure according to a second embodiment of the present invention, wherein

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
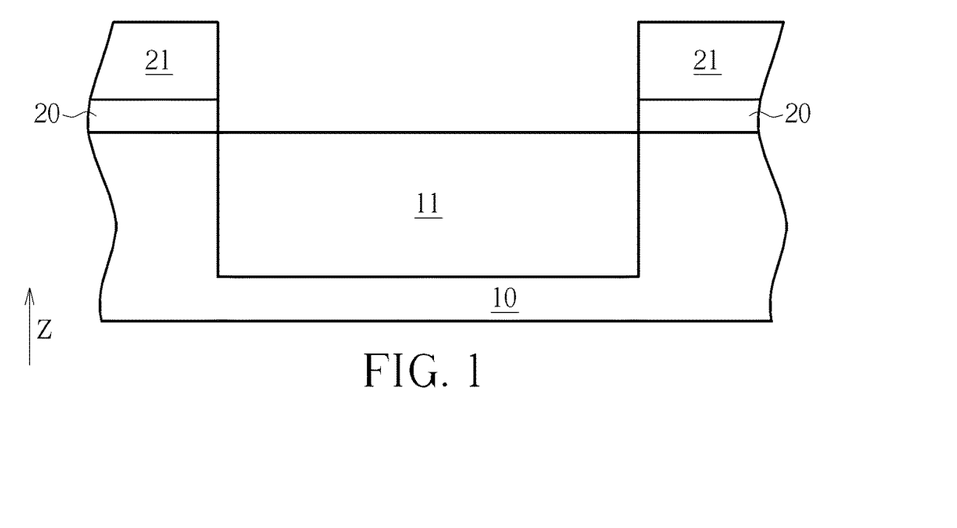
Figure 2:
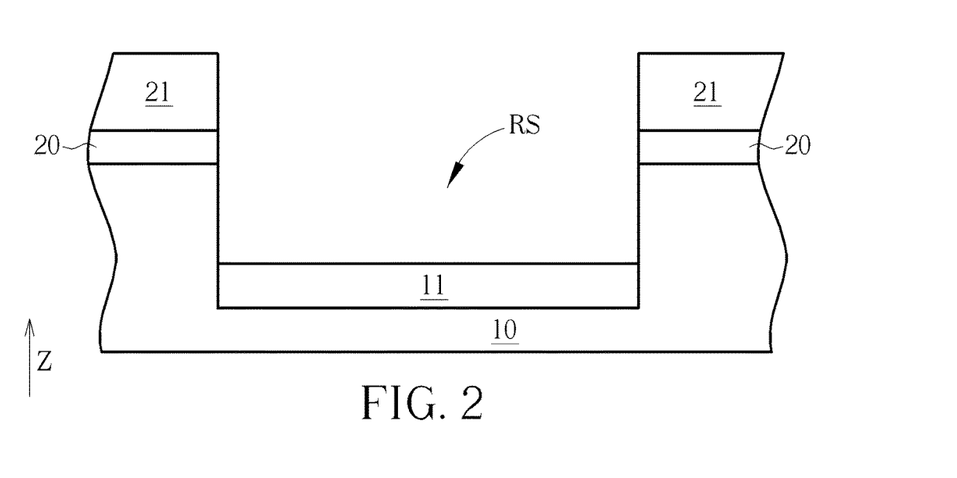
FIG. 2 is a schematic drawing in a step subsequent to FIG. 1.
Figure 3:
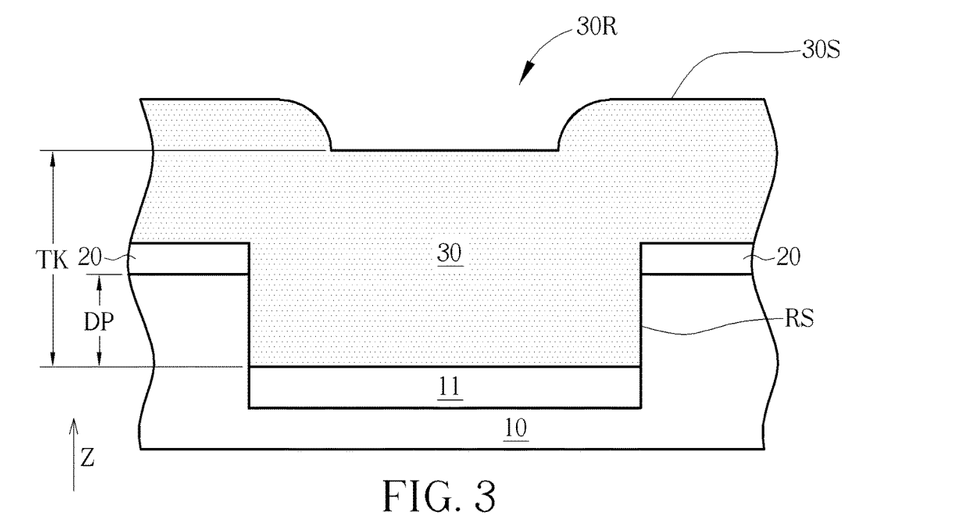
FIG. 3 is a schematic drawing in a step subsequent to FIG. 2.
Figure 4:
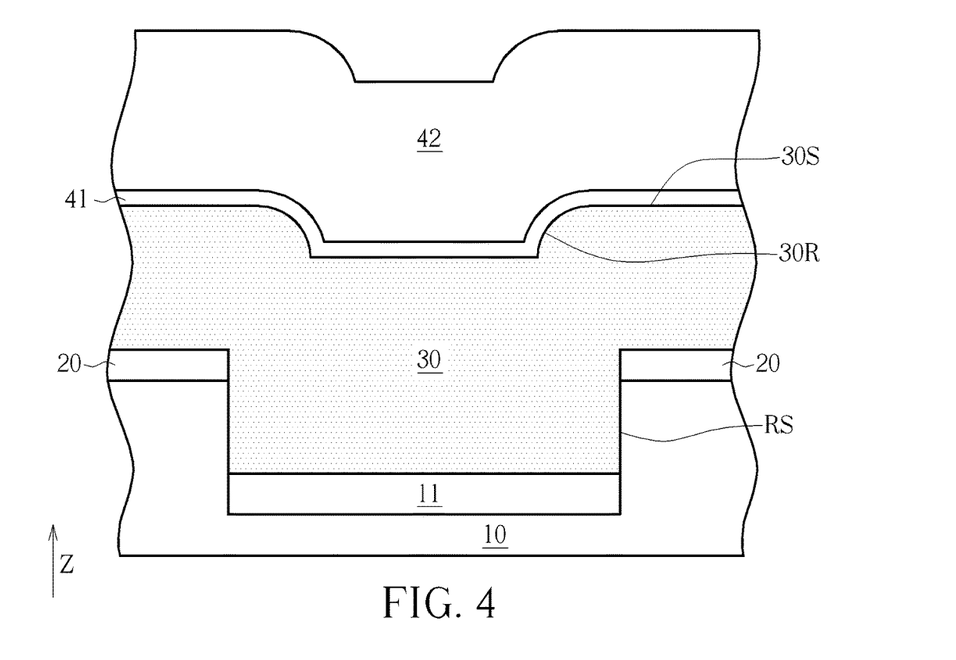
FIG. 4 is a schematic drawing in a step subsequent to FIG. 3.
Figure 5:
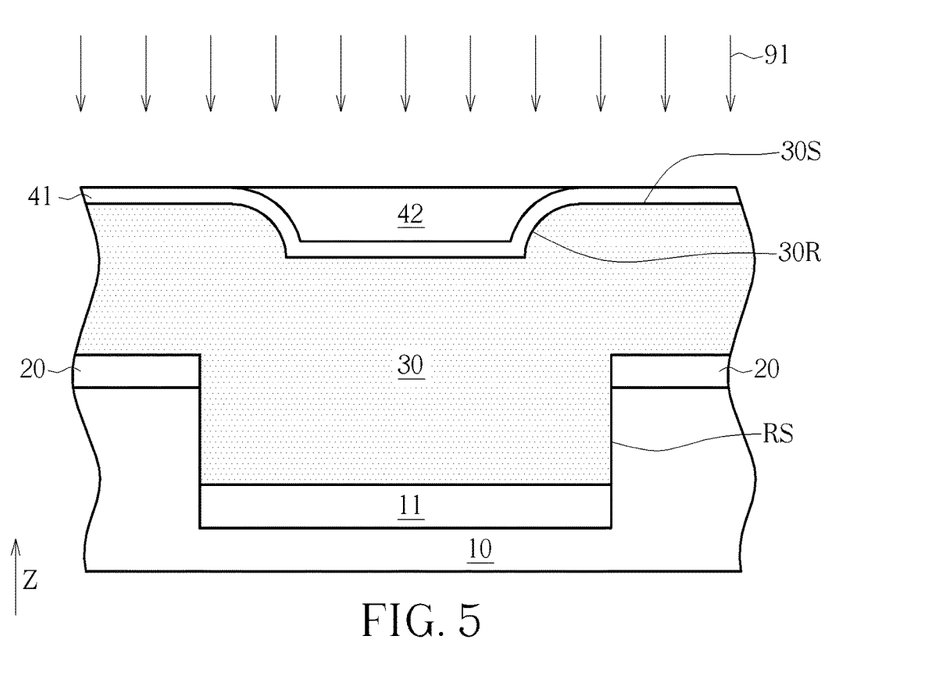
FIG. 5 is a schematic drawing in a step subsequent to FIG. 4.
Figure 6:
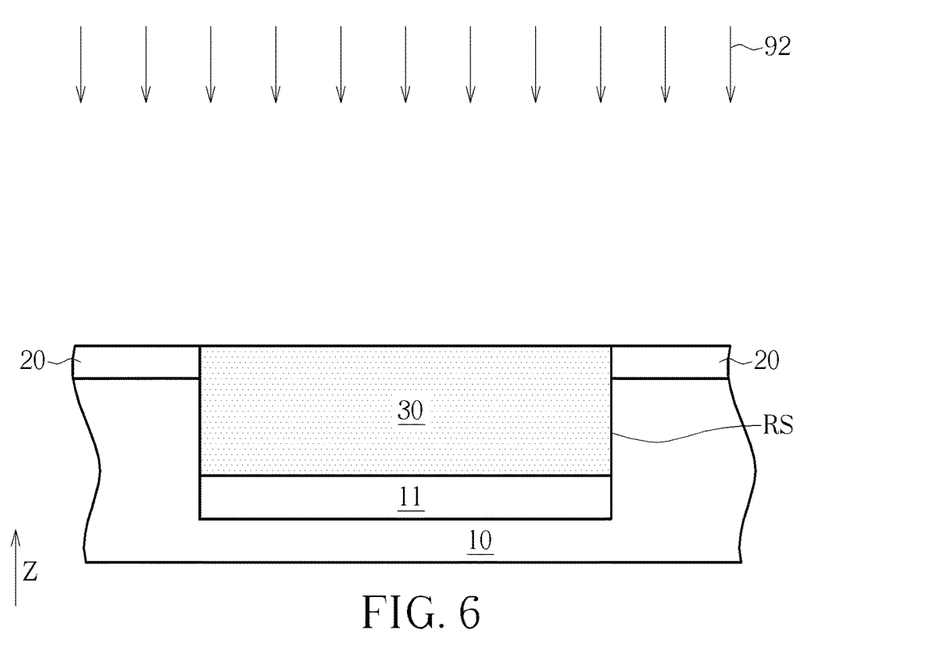
FIG. 6 is a schematic drawing in a step subsequent to FIG. 5.
Figure 7:
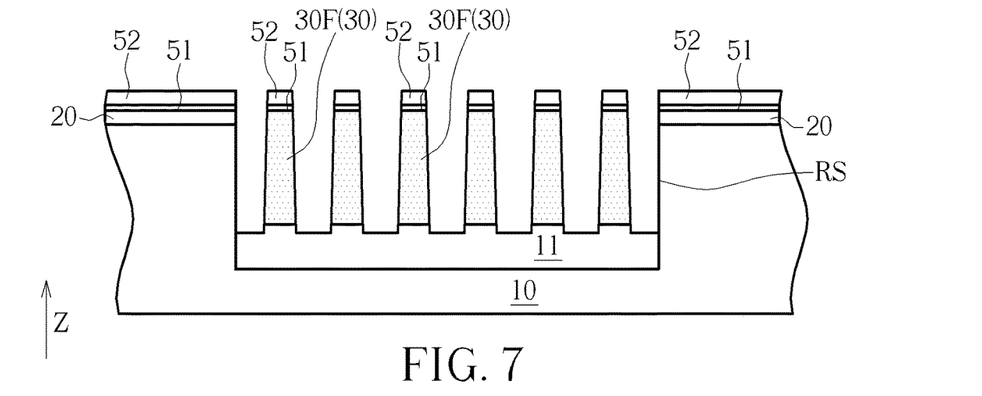
FIG. 7 is a schematic drawing in a step subsequent to FIG. 6.
Figure 8:
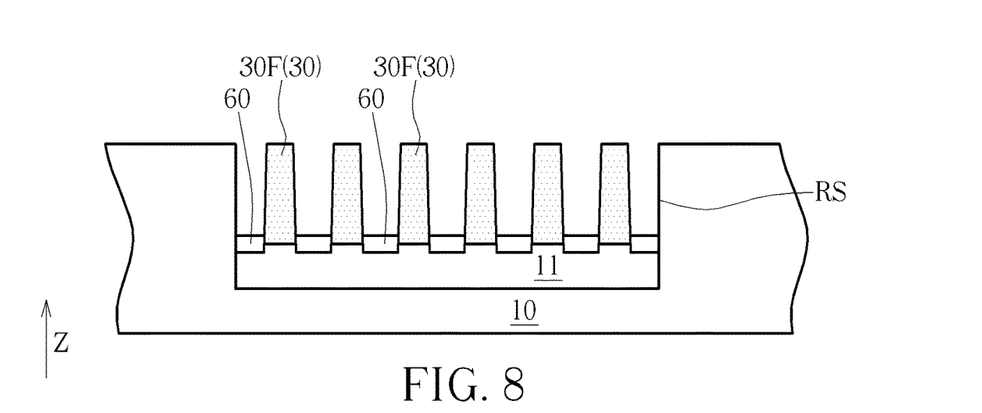
FIG. 8 is a schematic drawing in a step subsequent to FIG. 7.

Please refer to FIGS. 1-8. FIGS. 1-8 are schematic drawings illustrating a manufacturing method of an epitaxial fin-shaped structure according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7. The manufacturing method of the epitaxial fin-shaped structure in this embodiment may include the following steps. As shown in FIG. 1, a substrate is provided. In some embodiments, the substrate 10 may include a silicon substrate, a silicon-on insulator (SOI) substrate, or substrates made of other suitable materials. An oxide mask layer 20 is formed on the substrate 10, and a patterned photoresist layer 21 is formed on the oxide mask layer 20. The oxide mask layer 20 may include silicon oxide or other suitable oxide materials. In some embodiments, a part of the oxide mask layer 20 may be removed for exposing a part of the substrate 10 by an etching process using the patterned mask layer 21, and an ion implantation process may be performed to implant dopants to the substrate 10 which is not covered by the patterned photoresist layer 10 for forming a well 11. The part of the substrate 10 having the well 11 formed therein may be used to form active units such as fin-shaped transistors in subsequent processes, but not limited thereto. In some embodiments, the dopants used in the implantation process for forming the well 11 may be different in accordance with different types of transistors going to be formed, and the well 11 may include an N-well or a P-well.

As shown in FIG. 1 and FIG. 2, a recess RS is then formed in the substrate 10. In some embodiments, the recess RS may be formed by performing another etching process using the patterned photoresist layer 21 as a mask to remove a part of the substrate 10 including the well 11, but not limited thereto. In some embodiments, the patterned photoresist layer 21 may be removed, and the recess RS in the substrate 10 may be formed by performing an etching process using the oxide mask layer 20 as a mask. In other words, the oxide mask layer 20 may be formed on the substrate 10 before the step of forming the recess RS. Additionally, in some embodiments, the recess RS may be formed in the substrate 10 first, and the well 11 may be formed in the substrate 10 and formed under the recess RS after the step of forming the recess RS according to some considerations.

As shown in FIG. 2 and FIG. 3, the patterned photoresist layer 21 is removed subsequently, and an epitaxial layer 30 is formed on the substrate 10 after the step of removing the patterned photoresist layer 21. The epitaxial layer 30 may be partly formed in the recess RS and partly formed outside the recess RS. In some embodiments, the recess RS may be filled with the epitaxial layer 30, and a top surface 30S of the epitaxial layer 30 may be higher than the top surface of the substrate 10 and the top surface of the oxide mask layer 20 in a vertical direction (such as a thickness direction Z of the substrate 10). Therefore, a part of the epitaxial layer 30 formed outside the recess RS may be located on the oxide mask layer 20 in the thickness direction Z of the substrate 10, but not limited thereto. Additionally, a thickness TK of the epitaxial layer 30 may be larger than a depth DP of the recess RS. For instance, the depth DP of the recess RS may be about 500 angstroms and the thickness TK of the epitaxial layer 30 may be about 1250 angstroms. In some embodiments, the epitaxial layer 30 may be formed by a growth process such as a selective epitaxial growth (SEG) process, but not limited thereto. In this embodiment, the epitaxial layer 30 may be composed of silicon germanium (SiGe), but not limited thereto. In some embodiments, the epitaxial layer 30 may be composed of at least one or a combination selected from the group consisting of silicon, germanium, silicon carbide, gallium arsenide, indium phosphide, indium gallium arsenide, indium aluminum phosphide, and group III-V semiconductor materials. In the step of forming the epitaxial layer 30, the epitaxial layer 30 will have a dent 30R formed on the top surface 30S of the epitaxial layer 30 because of the influence of the topography of the substrate 10 and the recess RS, and the dent 30R is formed corresponding to the recess RS in the thickness direction Z of the substrate 10. In other words, the top surface 30S of the epitaxial layer 30 located above the oxide mask layer 20 may be higher than the surface of the dent 30R in the thickness direction Z of the substrate 10.

Subsequently, as shown in FIG. 4, a nitride layer 41 is conformally formed on the epitaxial layer 30, and an oxide layer 42 is formed on the nitride layer 41. The nitride layer 41 may include silicon nitride or other suitable nitride materials, and the oxide layer 42 may include silicon oxide or other suitable oxide materials. The nitride layer 41 and the oxide layer 42 may be formed by a deposition process such as a chemical vapor deposition, but not limited thereto. A part of the nitride layer 41 and a part of the oxide layer 42 may be formed in the dent 30R of the epitaxial layer 30, and another part of the nitride layer 41 and another part of the oxide layer 42 may be formed outside the dent 30R of the epitaxial layer 30. The dent 30R of the epitaxial layer 30 may be filled with the nitride layer 41 and the oxide layer 42. Additionally, the nitride layer 41 may be relatively thinner because the nitride layer 41 may be used as a stop layer in a planarization process performed subsequently and the nitride layer 41 has to be conformally formed on the top surface 30S of the epitaxial layer 30 and the surface of the dent 30R. In addition, the oxide layer 42 may be relatively thicker because the remaining space in the dent 30R has to be filled with the oxide layer 42. Accordingly, the oxide layer 42 may be thicker than the nitride layer 41. For example, in some embodiments, the thickness of the nitride layer 41 may be about 60 angstroms and the thickness of the oxide layer 42 may be about 1000 angstroms, but not limited thereto.

As shown in FIG. 4 and FIG. 5, a first planarization process 91 is performed to remove a part of the oxide layer 42, and the first planarization process 91 is stopped on the nitride layer 41. In some embodiments, the first planarization process 91 may include a chemical mechanical polishing (CMP) process or other suitable planarization approaches. The first planarization process 91 may be controlled to be stopped on the nitride layer 41 by the material difference between the nitride layer 41 and the oxide layer 42 and the influence of the dent 30R and the topography of the epitaxial layer 30 on the nitride layer 41. The nitride layer 41 and the oxide layer 42 formed in the dent 30R may still remain in the dent 30R after the first planarization process 91.

As shown in FIGS. 5-7, the epitaxial layer 30 in the recess RS is patterned for forming at least one epitaxial fin-shaped structure 30F. In some embodiments, a second planarization process 92 may be performed to remove the oxide layer 42, the nitride layer 41, and the epitaxial layer 30 outside the recess RS after the first planarization process 91 and before the step of forming the epitaxial fin-shaped structure 30F, but not limited thereto. The second planarization process 92 may be stopped on the oxide mask layer 20, and a part of the oxide mask layer 20 may be removed by the second planarization process 92, but not limited thereto. The second planarization process 92 may be different from the first planarization process 91. For example, the second planarization process 92 may include an etching back process or other suitable planarization approaches, and a process gas used in the etching back process may include carbon hexafluoride ($CF_6$), sulfur hexafluoride ($SF_6$), or other suitable process gases. In some embodiments, the required etching rate and the etching selectivity for different material layers may be obtained by modifying the process conditions of the second planarization process 92, such as the types and/or the composition ratio of the process gases in the etching back process. For example, the ratio of carbon hexafluoride to sulfur hexafluoride used in the etching back process may be about 15:1, but not limited thereto.

Additionally, the etching rate of the nitride layer 41 in the etching back process of the second planarization process 92 may be higher than the etching rate of the epitaxial layer 30 in the etching back process, the etching rate of the oxide layer 42 in the etching back process may be higher than the etching rate of the epitaxial layer 30 in the etching back process, and the etching rate of the oxide mask layer 20 in the etching back process may be higher than the etching rate of the epitaxial layer 30 in the etching back process for obtaining better flatness on the surface of the epitaxial layer 30 remaining after the second planarization process 92, but no limited thereto. For instance, the etching rate of the epitaxial layer 30 in the etching back process may be about 7 angstroms/second, and the ratio of the etching rate of the epitaxial layer 30 to the etching rate of the nitride layer 41, the oxide layer 42, and the oxide mask layer 20 in the etching back process may range from 1:1.02 to 1:1.03, but not limited thereto.

In some embodiments, a hard mask layer such as a first mask layer 51 and a second mask layer 52 may be formed on the epitaxial layer 30 and the oxide mask layer 20 after the second planarization process 92. The materials of the first mask layer 51 and the second mask layer 52 may include silicon oxide, silicon nitride, silicon oxynitride, or other suitable mask materials respectively, and the material of the second mask layer 52 may be different from the material of the first mask layer 51, but not limited thereto. Subsequently, a patterning method such as a sidewall image transfer (SIT) process or a photo-etching process may be used to remove a part of the second mask layer 52, a part of the first mask layer 51, and a part of the epitaxial layer 30 above the recess RS and a part of the substrate 10 for forming a plurality of epitaxial fin-shaped structures 30F. Since the formation of fin-shaped structures through SIT process or photo-etching process is well known to those skilled in the art, the details of which are not explained herein for the sake of brevity. Subsequently, as shown in FIG. 8, the first mask layer 51, the second mask layer 52, and the oxide mask layer 20 may be removed, and a shallow trench isolation 60 may be formed between the epitaxial fin-shaped structures 30F. Subsequently, a fin-shaped transistor fabrication process may be performed. For example, gate structures may be formed on the epitaxial fin-shaped structures 30F, and source/drain regions may be formed in the epitaxial fin-shaped structures 30F, but not limited thereto.

It is worth noting that, as shown in FIGS. 5-8, the dishing recess issue which may be generated by removing the epitaxial layer 30 with a single CMP process may be avoided in the manufacturing method of the present invention because the first planarization process 91 is performed first and stopped at the nitride layer 41 and the second planarization process 92 is performed after the first planarization process 91 to remove the epitaxial layer 30 outside the recess RS. The height uniformity of the epitaxial fin-shaped structures 30F formed by the epitaxial layer may be improved, and the electrical performance of the semiconductor device formed by the epitaxial fin-shaped structures 30F may be enhanced also.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 9:
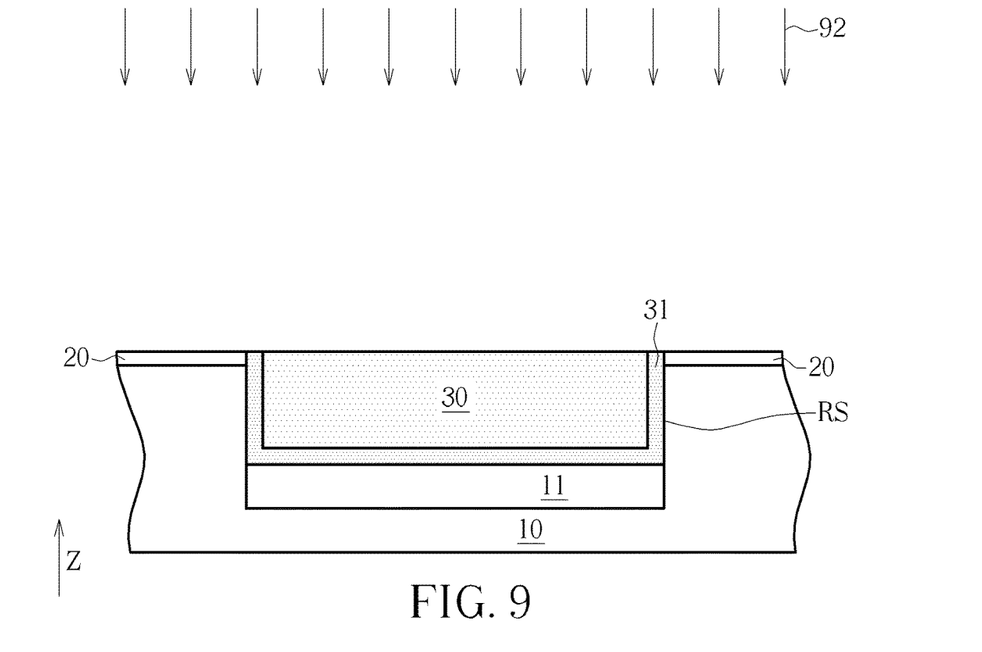
Figure 10:
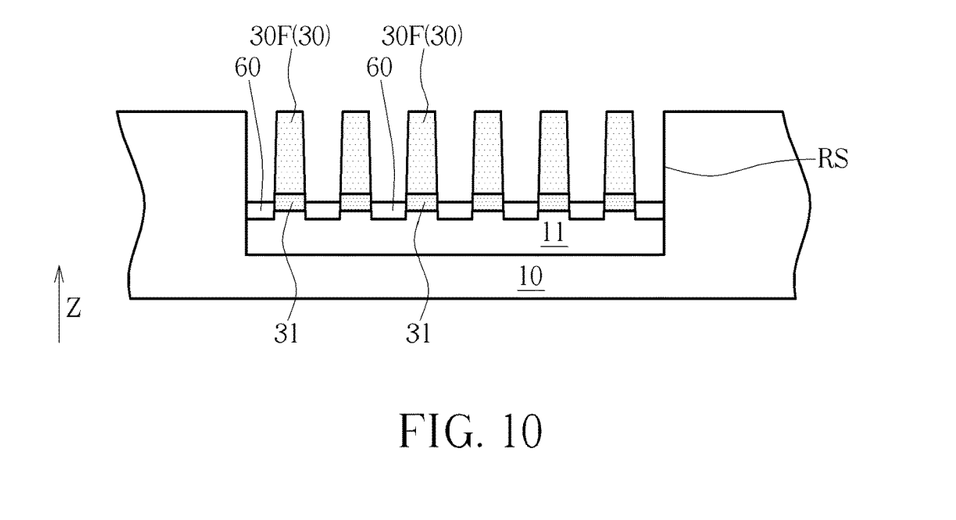
FIG. 10 is a schematic drawing in a step subsequent to FIG. 9.

Please refer to FIG. 9 and FIG. 10. FIG. 9 and FIG. 10 are schematic drawings illustrating a manufacturing method of an epitaxial fin-shaped structure according to a second embodiment of the present invention, and FIG. 10 is a schematic drawing in a step subsequent to FIG. 9. As shown in FIG. 9, the difference between the manufacturing method of the first embodiment described above and the manufacturing method of this embodiment is that a buffer layer 31 may be formed in the recess RS before the step of forming the epitaxial layer 30 in the manufacturing method of this embodiment, and the epitaxial layer 30 in the recess RS may be formed on the buffer layer 31. In some embodiments, the buffer layer 31 may be used to adjust the stress between the well 11 and the epitaxial layer 30, and the material of the buffer layer 31 may include silicon germanium, but not limited thereto. For example, the buffer layer 31 may be composed of at least one or a combination selected from the group consisting of silicon, germanium, silicon carbide, gallium arsenide, indium phosphide, indium gallium arsenide, indium aluminum phosphide, and group III-V semiconductor materials according to process requirements. Additionally, the material composition ratio of the buffer layer 31 may be different from the material composition ratio of the epitaxial layer 30. For instance, the germanium concentration of the buffer layer 31 may be lower than the germanium concentration of the epitaxial layer 30 when the buffer layer 31 and the epitaxial layer 30 are silicon germanium layers, but not limited thereto. As shown in FIG. 10, the buffer layer 31 and the epitaxial layer 30 may be patterned together by the step of patterning the epitaxial layer 30 for forming the epitaxial fin-shaped structures 30F, and the shallow trench isolation 60 may surround the patterned buffer layer 31, but not limited thereto.

To summarize the above descriptions, according to the manufacturing method of forming the epitaxial fin-shaped structure in the present invention, the first planarization process may be performed after forming the nitride layer and the oxide layer on the epitaxial layer and be stopped on the nitride layer, and the second planarization process is performed after the first planarization process for improving the height uniformity of the epitaxial fin-shaped structures formed by the epitaxial layer and enhancing the electrical performance of the semiconductor device formed by the epitaxial fin-shaped structures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of an epitaxial fin-shaped structure, comprising:
   providing a substrate;
   forming a recess in the substrate;
   forming an epitaxial layer on the substrate, wherein the epitaxial layer is partly formed in the recess and partly formed outside the recess, and the epitaxial layer comprises a dent formed on the top surface of the epitaxial layer and formed corresponding to the recess in a thickness direction of the substrate;
   forming a nitride layer conformally on the epitaxial layer;
   forming an oxide layer on the nitride layer;
   performing a first planarization process to remove a part of the oxide layer, wherein the first planarization process is stopped on the nitride layer; and
   patterning the epitaxial layer in the recess for forming at least one epitaxial fin-shaped structure.

2. The manufacturing method of the epitaxial fin-shaped structure according to claim 1, wherein a part of the nitride layer and a part of the oxide layer are formed in the dent of the epitaxial layer.

3. The manufacturing method of the epitaxial fin-shaped structure according to claim 2, wherein the nitride layer and the oxide layer formed in the dent remain in the dent after the first planarization process.

4. The manufacturing method of the epitaxial fin-shaped structure according to claim 1, further comprising:
   performing a second planarization process to remove the oxide layer, the nitride layer, and the epitaxial layer outside the recess after the first planarization process and before the step of forming the epitaxial fin-shaped structure.

5. The manufacturing method of the epitaxial fin-shaped structure according to claim 4, wherein the second planarization process comprises an etching back process, and the first planarization process comprises a chemical mechanical polishing (CMP) process.

6. The manufacturing method of the epitaxial fin-shaped structure according to claim 5, wherein the etching rate of the nitride layer in the etching back process is higher than the etching rate of the epitaxial layer in the etching back process.

7. The manufacturing method of the epitaxial fin-shaped structure according to claim 5, wherein the etching rate of the oxide layer in the etching back process is higher than the etching rate of the epitaxial layer in the etching back process.

8. The manufacturing method of the epitaxial fin-shaped structure according to claim 5, wherein a process gas used in the etching back process comprises carbon hexafluoride ($CF_6$) and sulfur hexafluoride ($SF_6$).

9. The manufacturing method of the epitaxial fin-shaped structure according to claim 4, further comprising:
   forming an oxide mask layer on the substrate before the step of forming the recess, wherein the second planarization process is stopped on the oxide mask layer.

10. The manufacturing method of the epitaxial fin-shaped structure according to claim 1, wherein the oxide layer is thicker than the nitride layer.

11. The manufacturing method of the epitaxial fin-shaped structure according to claim 1, wherein a thickness of the epitaxial layer is larger than a depth of the recess.

12. The manufacturing method of the epitaxial fin-shaped structure according to claim 1, further comprising:
   forming a buffer layer in the recess before the step of forming the epitaxial layer, wherein the epitaxial layer in the recess is formed on the buffer layer.

* * * * *